United States Patent [19]
Kosinski

[11] Patent Number: 5,834,881
[45] Date of Patent: Nov. 10, 1998

[54] MOUNTING ARRANGEMENT FOR CRYSTAL RESONATORS

[75] Inventor: John A. Kosinski, Wall, N.J.

[73] Assignee: The United States of America as represented by the Secretary of the Army, Washington, D.C.

[21] Appl. No.: 907,768

[22] Filed: Aug. 8, 1997

[51] Int. Cl.⁶ ................................................. H01L 41/08

[52] U.S. Cl. ............................................ 310/351; 310/345

[58] Field of Search ................................... 310/351, 352, 310/345

[56] References Cited

U.S. PATENT DOCUMENTS 2,128,420  8/1938  Laskey ...................................... 310/351

*Primary Examiner*—Mark O. Budd
*Attorney, Agent, or Firm*—Michael Zelenka; John M. O'Meara

[57] ABSTRACT

Mounting arrangements are provided for crystals, which greatly reduces or eliminates the effect of the force which develops on the crystal when acceleration is encountered. In these arrangements, flexible bushings are incorporated to absorb energy during periods of acceleration and collars are incorporated between which portions of the crystal are gripped to stiffen the structural characteristics thereof.

12 Claims, 4 Drawing Sheets

5,834,881

MOUNTING ARRANGEMENT FOR CRYSTAL RESONATORS

GOVERNMENT INTEREST

The invention described herein may be manufactured, used, and licensed by or for the United States Government for governmental purposes without payment to me of any royalties thereon.

BACKGROUND OF THE INVENTION

The present invention relates to a mounting arrangement for crystals and more particularly, one which greatly reduces or eliminates the effect of the force which develops on the crystal when acceleration is encountered. Such force would otherwise cause the crystal to distort and thereby generate erroneous signals. Although attempts have been made in the prior art to reduce or eliminate the effect of this force, no comprehensive solution has been found to the problems which result therefrom.

SUMMARY OF THE INVENTION

It is the general object of the present invention to provide a crystal mounting arrangement that greatly reduces or eliminates the effect of the force applied to the crystal when acceleration is encountered.

It is a specific object of the present invention to accomplish the general object through energy absorption.

It is a further object of the present invention to supplement the specific object with structural stiffening.

These and other objects are accomplished in accordance with the present invention, by incorporating flexible bushings into the crystal mounting arrangement to absorb energy during periods of acceleration and collars between which portions of the crystal are gripped to stiffen the structural characteristics thereof.

The scope of the present invention is only limited by the appended claims for which support is predicated on the preferred embodiments set forth hereafter in the following description and the attached drawings wherein like reference characters relate to like parts throughout the figures thereof.

DESCRIPTION OF THE PREFERRED EMBODIMENTS

Figure 1:
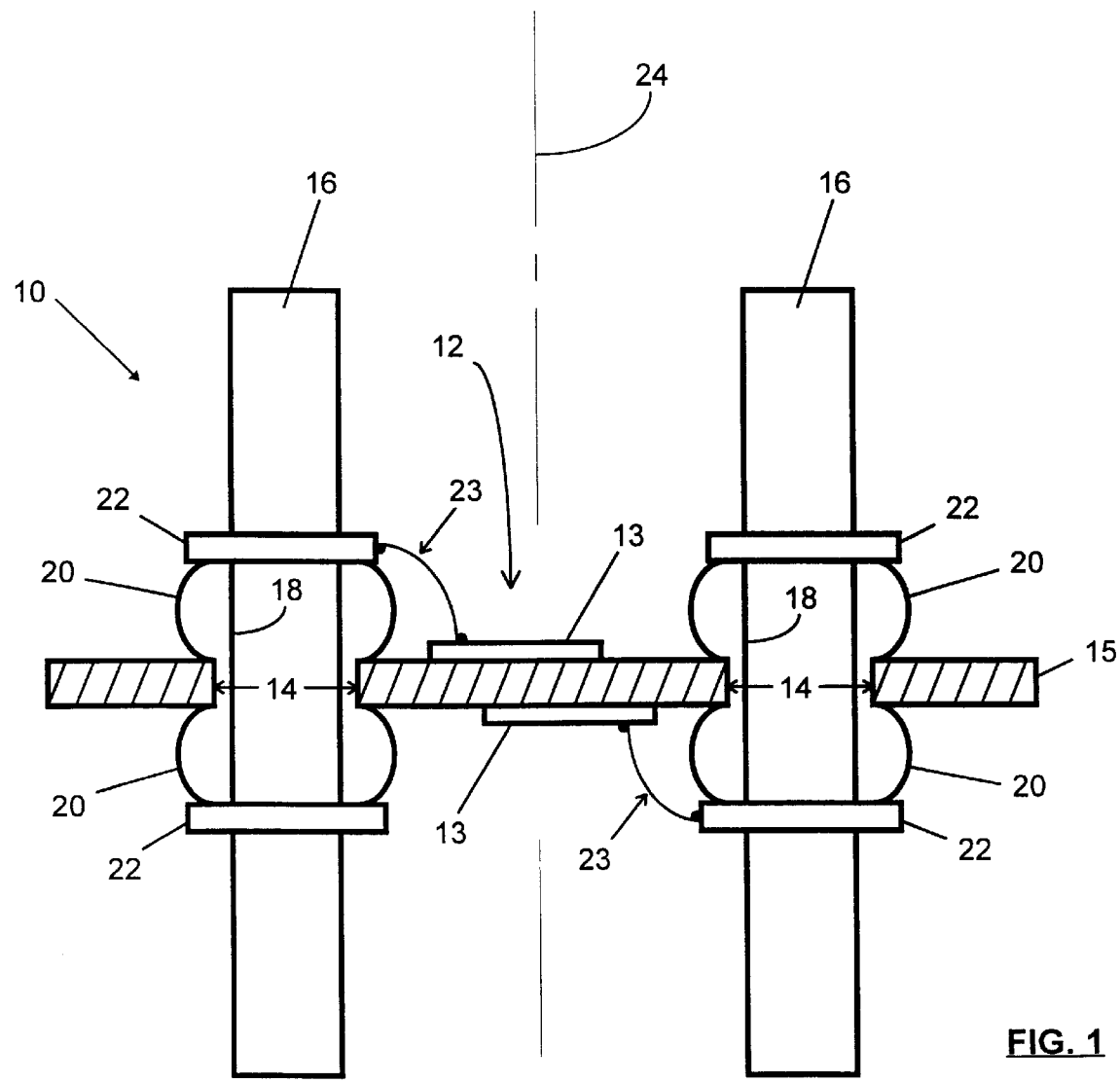
FIG. 1 is a side view of a crystal mounting arrangement, with the energy absorption feature of the invention incorporated therein.

FIG. 1 relates to a crystal mounting arrangement 10 in accordance with the present invention. A crystal 12 having electrodes 13 thereon, such as one of piezoelectric material, is included within arrangement 10. At least two apertures 14 pass through crystal 12 which may have any conventional crystal configuration but for the sake of discussion, is shown to be a substrate 15 with a rectilinear configuration. A mounting support 16 of rigid material is disposed through each aperture 14, with portions of each support 16 extending from both sides of the crystal 12. Therefore, crystal 12 is not supported about its periphery which overhangs the supports 16. As is commonly known, any acceleration force in this overhang will oppose any acceleration force in the portion of the crystal 12 that is interiorly disposed relative to the supports 16, to thereby minimize flexure therein. A flexible bushing 18 of substantially tubular configuration that includes bulbous ends 20, is disposed about each support 16 with one bulbous end 20 thereof located on each side of the aperture 14 to which that support 16 relates.

Collars 22 are affixed about each support 16, such as with set screws (not shown), to secure the disposition of the bushing 18 on that support 16. Electrical connections 23 are disposed between the electrodes 13 and collars 22.

When the crystal mounting arrangement 10 encounters an acceleration in either direction along an axis 24, the bushings 18 therein function to absorb energy in some proportion to the force applied thereto by the crystal 12, as the result of that acceleration. Those skilled in the art of energy absorption will understand without further explanation herein, that the energy absorption proportionality factor is dependent on the spring constants that are presented by the bushings 18. Consequently, the bushings 18 can be designed to nullify all of the force applied thereto by the crystal 12 and thereby preclude any flexure in the crystal 12 and any spurious signal outputs therefrom.

Figure 2:
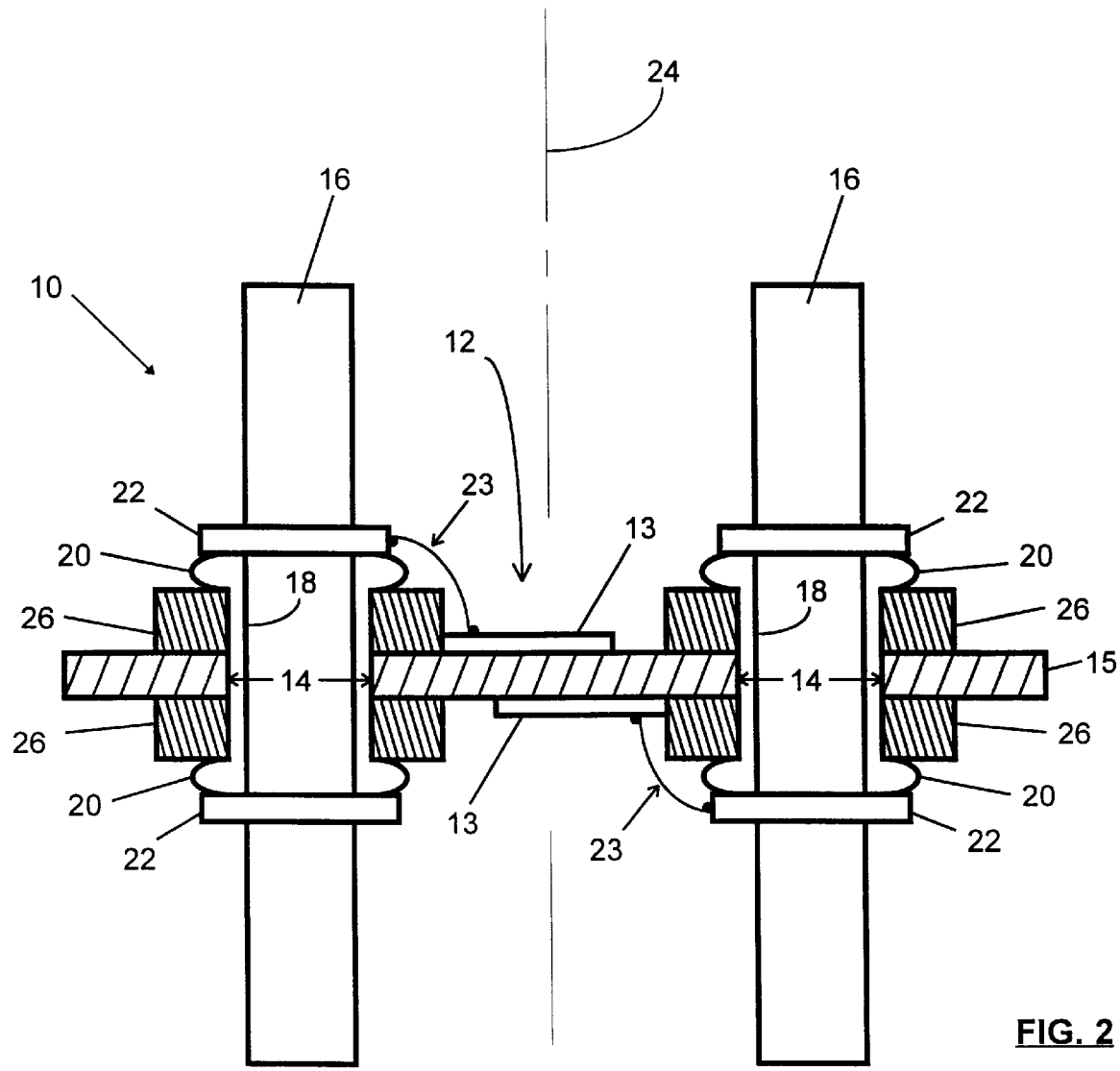
FIG. 2 is the crystal mounting arrangement of FIG. 1, with the structural stiffening feature of the invention incorporated therein.

Because acceleration causes the force that is applied to the bushings 18 by the crystal 12, force components must be translated through the crystal 12 due to the distributed mass thereof, as is well known from the field of statics. Therefore, flexure may still occur within the crystal 12 if the structural stiffness thereof is not sufficient to translate the component forces. However, the crystal 12 may be stiffened within embodiments of the invention, as shown in FIG. 2, to reduce or eliminate such flexure. In these embodiments of the mounting arrangement 10', a stiffening collar 26 is disposed about each support 16, between each bulbous end 20 and the crystal 12. These collars 26 extend away from the support 16 for some distance and therefore, render the crystal 12 more rigid.

In the preferred embodiments, the apertures 14 are disposed in a plane and symmetrically about an orthogonal axis which is perpendicular to the plane so that the effects of acceleration are nullified across the plane, as is commonly known in the art. It is also well known that shear deformation and anti-symmetric flexure resulting from in-plane acceleration can be eliminated by maintaining symmetry across an orthogonal axis that passes in the thickness plane of the crystal 12. Furthermore, it is commonly known that for rectangularly configured crystals, the aspect ratio thereof can be tailored to nullify the effect of acceleration across the major planar surface thereon because the crystal sensitivity components for orthogonal flexure, are of opposite polarities. Therefore, structural symmetry about each of the orthogonal axes is desirable to nullify the effects of acceleration on the crystal mounting arrangement 10.

Figure 3:
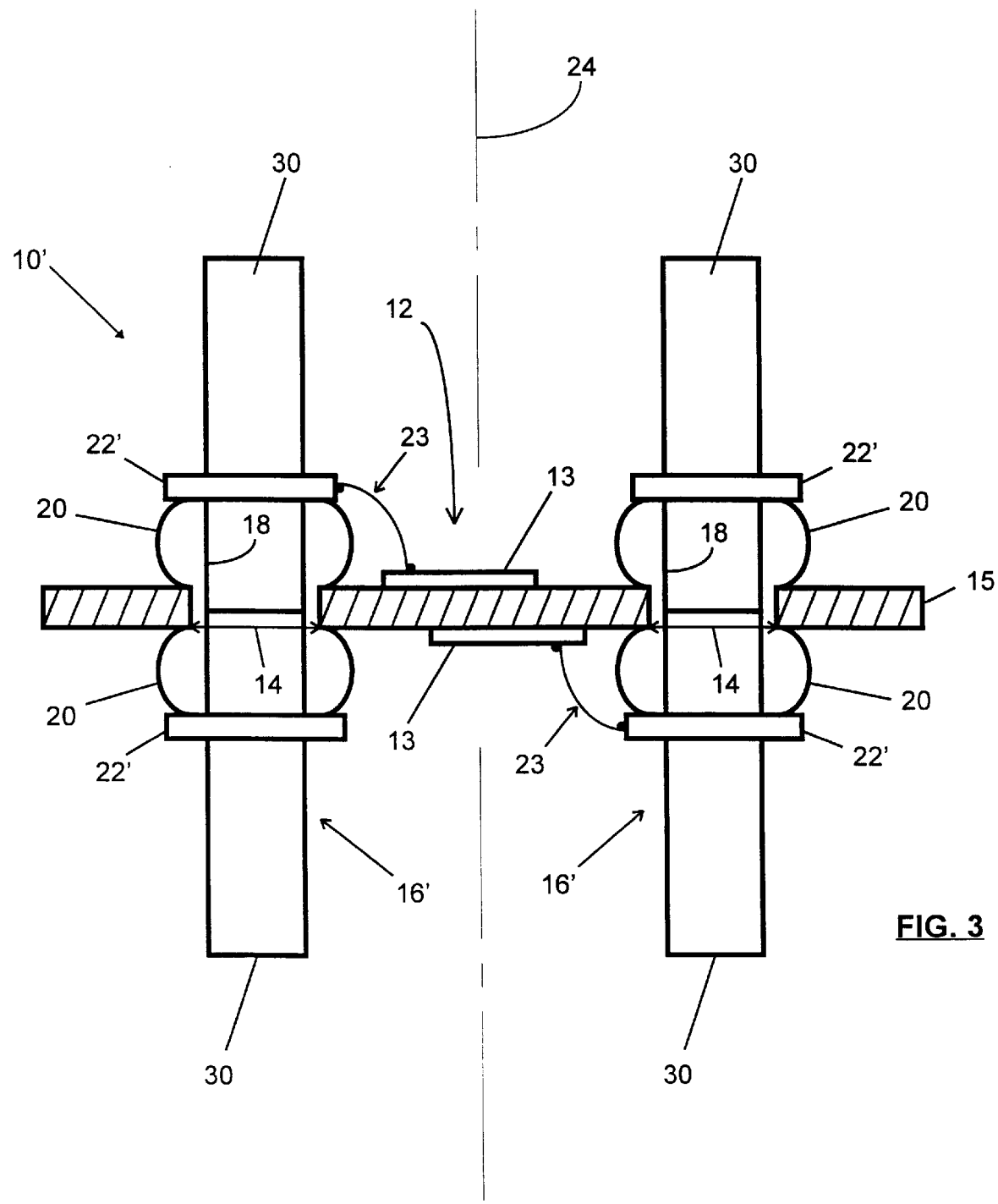
FIG. 3 is the crystal mounting arrangement of FIG. 1, with modifications thereto which facilitate the assembly thereof.
Figure 4:
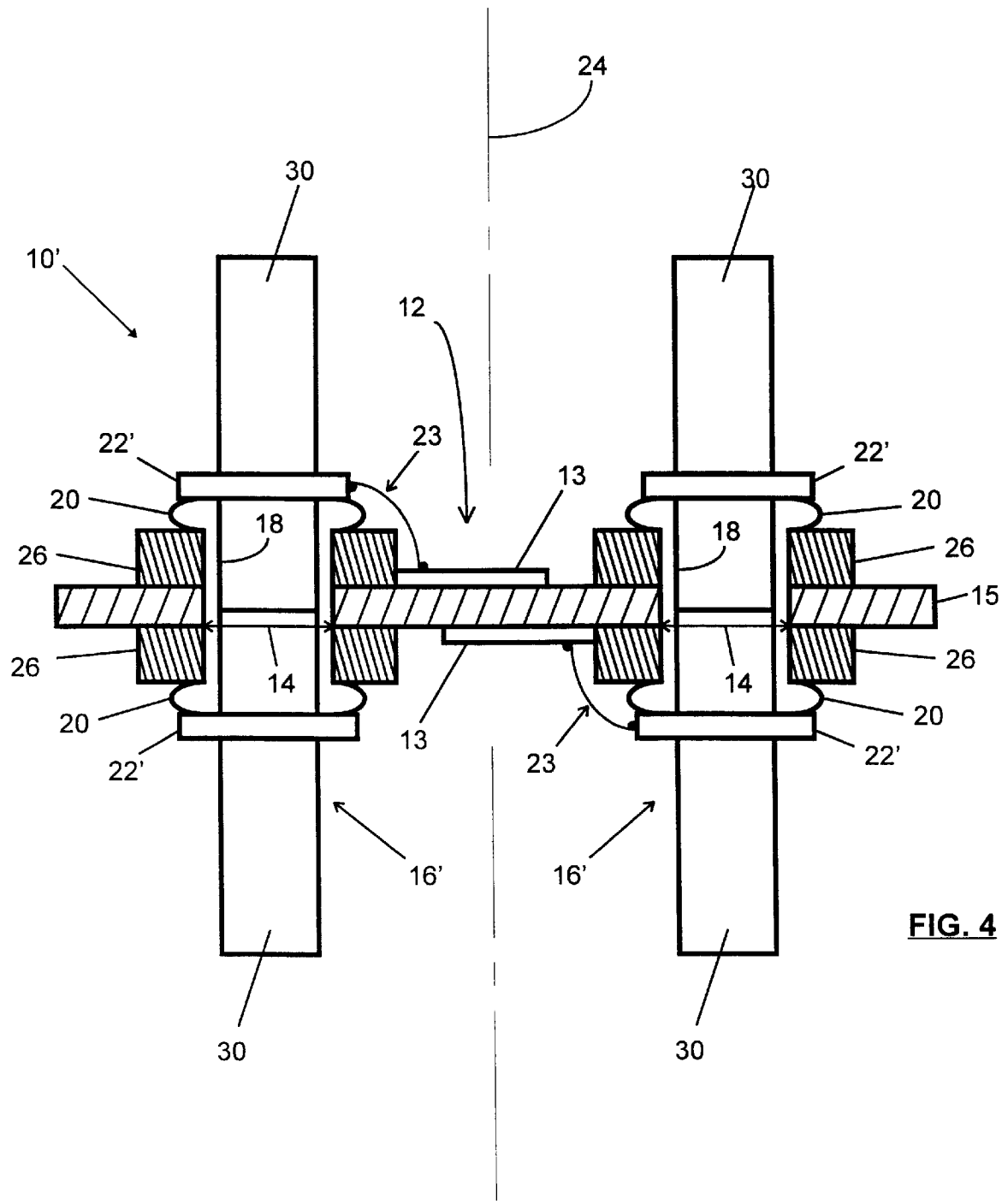
FIG. 4 is the crystal mounting arrangement of FIG. 2, with modifications thereto which facilitate the assembly thereof.

Embodiments of the invention also exist which facilitate assembly of the mounting arrangement. Two such embodiments are shown in FIGS. 3 and 4 which include the identical component parts as the embodiments shown in FIGS. 1 and 2 respectively, except for the mounting supports 16 and collars 22 which are modified to facilitate assembly. Each mounting support 16' in the crystal mounting arrangements 10' of FIGS. 3 and 4 includes two longitudinal segments 30. Means 32, such as mating threads (not shown), must be included to join the segments 30 in the mounting arrangements 10' of FIGS. 3 and 4. One collar 22' is integrally affixed to each segment 30 at the appropriate location along the longitudinal axis thereof for securing the disposition of the bushing 18 along that axis, when the segments 30 are joined during the assembly of the mounting arrangements 10'. The means 32 for joining the segments 30 can also be provided by integrating the crystal mounting arrangements 10' with another structure, such as a hermetically sealed container. One possibility would be to span the length, width or depth of the container with the joined segments 30 which are secured by glass seals in the sides of the container.

Those skilled in the art will appreciate without any further explanation that within the concept of this invention many modifications and variations are possible to the above disclosed embodiments of the crystal mounting arrangement. Consequently, it should be understood that all such variations and modifications fall within the scope of the following claims.

What I claim is:

1. A crystal mounting arrangement, comprising:
   a crystal having at least two apertures disposed therethrough;
   at least two mounting supports, each support being disposed through one of the apertures with portions thereof extending on both sides of that aperture;
   at least two flexible bushings of substantially tubular configuration that includes bulbous ends, each bushing being disposed about one of the supports with one bulbous end thereof located on each side of the aperture to which that support relates;
   retaining collars affixed on each support to secure the disposition of the bushing on that support; and
   a stiffening collar is disposed about the supports, between the crystal and each bulbous end on the bushings.

2. The mounting arrangement of claim 1 wherein each mounting support includes two longitudinal sections which are joined by fastening means and one retaining collar is integrally affixed to each longitudinal section.

3. The mounting arrangement of claim 2 wherein each tubular bushing includes two longitudinal sections, with each section having one bulbous end.

4. The mounting arrangement of claim 3 wherein the crystal has a rectilinear configuration.

5. The mounting arrangement of claim 1 wherein the crystal has a rectilinear configuration.

6. The mounting arrangement of claim 1 wherein the apertures are symmetrically disposed relative to a first orthogonal axis passing perpendicularly through the thickness plane of the crystal.

7. The mounting arrangement of claim 6 wherein symmetry is also maintained relative to a second orthogonal axis disposed in the thickness plane of the crystal.

8. The mounting arrangement of claim 1 wherein is further maintained relative to a third orthogonal axis.

9. A crystal mounting arrangement, comprising:
   a crystal having a rectilinear configuration and at least two apertures disposed therethrough;
   at least two mounting supports, each support includes two longitudinal sections and is disposed through one of the apertures with portions thereof extending on both sides of that aperture;
   fastening means for joining the longitudinal sections of each support;
   at least two flexible bushings of substantially tubular configuration, each bushing includes two longitudinal sections with each bushing section having one bulbous end and each bushing is disposed about one of the supports with one bulbous end thereof located on each side of the aperture to which that support relates;
   retaining collars for securing the disposition of the bushings on the supports, each collar is integrally affixed to one longitudinal section of the supports; and
   a stiffening collar is disposed about the supports, between the crystal and each bulbous end on the bushings.

10. A crystal mounting arrangement, comprising:
    a crystal having a rectilinear configuration and at least two apertures symmetrically disposed therethrough relative to an orthogonal axis;
    at least two mounting supports, each support includes two longitudinal sections and is disposed through one of the apertures with portions thereof extending on both sides of that aperture;
    fastening means for joining the longitudinal sections of each support;
    at least two flexible bushings of substantially tubular configuration, each bushing includes two longitudinal sections with each bushing section having one bulbous end and each bushing is disposed about one of the supports with one bulbous end thereon located on each side of the aperture to which that support relates; and
    retaining collars for securing the disposition of the bushings on the supports, each collar is integrally affixed to one longitudinal section of the supports.

11. The mounting arrangement of claim 10 wherein a stiffening collar is disposed about the supports, between the crystal and each bulbous end on the longitudinal sections of the bushings.

12. A crystal mounting arrangement, comprising:
    a crystal having a rectilinear configuration and at least two apertures disposed therethrough;
    at least two mounting supports, each support being disposed through one of the apertures with portions thereof extending on both sides of that aperture;
    at least two flexible bushings of substantially tubular configuration that includes bulbous ends, each bushing being disposed about one of the supports with one bulbous end thereof located on each side of the aperture to which that support relates;
    retaining collars affixed on each support to secure the disposition of the bushing on that support; and
    a stiffening collar is disposed about the supports, between the crystal and each bulbous end on the bushings.

* * * * *